United States Patent [19]

Tanaka

[11] Patent Number: 5,081,604
[45] Date of Patent: Jan. 14, 1992

[54] FINITE IMPULSE RESPONSE (FIR) FILTER USING A PLURALITY OF CASCADED DIGITAL SIGNAL PROCESSORS (DSPS)

[75] Inventor: Yoshiaki Tanaka, Fujisawa, Japan
[73] Assignee: Victor Company of Japan, Ltd., Kanagawa, Japan
[21] Appl. No.: 415,326
[22] PCT Filed: Dec. 1, 1988
[86] PCT No.: PCT/JP88/01218
   § 371 Date: Sep. 18, 1989
   § 102(e) Date: Sep. 18, 1989
[87] PCT Pub. No.: WO89/05544
   PCT Pub. Date: Jun. 15, 1989

[30] Foreign Application Priority Data

Dec. 2, 1987 [JP] Japan .................. 62-305443

[51] Int. Cl.$^5$ .............................. G06F 15/31
[52] U.S. Cl. ................................ 364/724.16
[58] Field of Search ..................... 364/724.16

[56] References Cited

U.S. PATENT DOCUMENTS

| | | | |
|---|---|---|---|
| 3,717,756 | 2/1973 | Stitt | 364/724.16 |
| 3,980,873 | 9/1976 | Mattei | 364/724.12 |
| 4,805,129 | 2/1989 | David | 364/724.16 |

FOREIGN PATENT DOCUMENTS 57-208722 12/1982 Japan .
59-220879 12/1984 Japan .
62-91010 4/1987 Japan .
62-131618 6/1987 Japan .

OTHER PUBLICATIONS

Motorola Semiconductor Technical Data, Technical Summary Cascadable Adaptive Funite Impulse Digital Filter (CAFIR), Feb. 2, 1987, Motorola Literature Distribution, Phoenix Az.
Motorola Semiconductor Technical Data, Advance Information Cascadable Adaptive Finite Impulse Response Digital Filter Chip, Jan. 1987, Motorola Literature Distribution, Phoenix Az.
Electro Conference Record, vol. 4, 24–26, Apr. 1979, pp. 1–5; M. J. Narasimha et al.

*Primary Examiner*—Dale M. Shaw
*Attorney, Agent, or Firm*—Michael N. Meller

[57] ABSTRACT

An FIR digital filter device of the symmetrical coefficient type or the antisymmetrical coefficient type or which processes digital data signals such as digital audio signals. In the FIR digital filter device, a digital input data is transferred in the forward direction through a plurality of digital signal processors (F, B) connected in cascade and is then transferred in the reverse direction to form M pieces of delayed digital data. The digital signal processor in each stage effects the algebraic addition of said delayed digital data and the digital input data through a first operation unit (46), effects the multiplication result through a multiplier (47), adds up the multiplied result through a second operation unit (37), and transfers the obtained data as carry-over data to the next stage.

4 Claims, 6 Drawing Sheets

FINITE IMPULSE RESPONSE (FIR) FILTER USING A PLURALITY OF CASCADED DIGITAL SIGNAL PROCESSORS (DSPS)

TECHNICAL FIELD

The present invention relates to an FIR digital filter device of the symmetrical coefficient type or the antisymmetrical coefficient type, and particularly to an FIR digital filter device for use in signal processing of a digital audio signal such as a PCM audio signal.

BACKGROUND ART

As is well known, high-quality recording and reproduction can be achieved by applying digital techniques to signal processing of an audio signal, when recording or reproducing the audio signal.

A tone control device is known as a conventional art that processes an audio signal by digital techniques. A tone control device aims to suitably adjusting tone quality of a reproduced audio signal, depending on a program source and the state of a listening room. For this purpose, a tone control device processes an audio signal in digital form.

The tone control device can change the frequency-amplitude characteristic of an audio signal which is the subject of tone control. A change of the frequency-amplitude characteristic of an audio signal by the tone control device may cause in a change in phase of the audio signal. This changes of the assigned position in a stereoscopic reproduction sound field. For this reason, an improved tone control device is desired that causes no change in phase of an audio signal even when the frequency-amplitude characteristic thereof is varied.

A digital filter having the linear phase characteristic is attractive as a tone control device which can satisfy the above-mentioned need. A digital filter having the linear phase characteristic uses a finite impulse response (FIR) digital filter, which has a constant group delay irrespective of a change of the frequency-amplitude characteristic.

An FIR digital filter is designed to execute digital filtering operations so as to provide a desired frequency-amplitude characteristic by using a digital signal processor (hereinafter simply referred to as DSP). The number of operations (number of taps) that the DSP repetitively carries out the digital filter operation is based on a desired frequency-amplitude characteristic. It is noted that an extremely large number of operations that the DSP repetitively carries out the digital filter operation is necessary to obtain a desired frequency-amplitude characteristic which is highly precise even in a low-frequency range of the audio signal.

Therefore, such a conventional FIR digital filter needs a long operation time. The digital filter operation is repetitively carried out for predetermined times during a necessary sampling period. Therefore, a large number of multipliers and memories is necessary to execute the digital filter operation in real time.

When many multipliers and memories are formed on a single DSP chip, they will take about two-thirds of the size of the DSP chip. This needs a large chip size. On the other hand, when a DSP having a minimum of multipliers and memories is formed on a chip of small size, a real time digital filter operation needs many DSPs connected in parallel. This is not economical.

An object of the present invention is to provide an economical FIR digital filter which can process a digital audio signal in real time without decreasing economical efficiency.

DISCLOSURE OF THE INVENTION

The present invention relates to an FIR digital filter device of the symmetrical coefficient type or the antisymmetrical coefficient type which generates M (M is a natural number equal to or more than 2) pieces of delayed digital data having mutually different delay times equal to natural number times a sampling period for digital input data, multiplies the M pieces of delayed digital data and the digital input data by multiplication coefficients, and adds up the multiplied results to form output data.

According to the present invention, there is provided a plurality of cascaded digital signal processors each adding, through an adder, a pair of digital data having symmetrical delay times with the center of symmetry corresponding to a delay time equal to M/2 as large as the sampling period, multiplying the addition results by multiplication coefficients through a multiplier, and adding up the multiplied results through an operation unit. The digital input data are transferred in the forward and reverse directions through the plurality of digital signal processors. The digital signal processors in the second and following stages add the accumulated data in the operation unit to carry-over data supplied from the digital signal processor in the previous stage, thereby outputting carry-over data to be supplied to the next stage. The digital filter output of the FIR digital signal device is drawn from the digital signal processor in the final stage.

The FIR digital filter device of the symmetrical coefficient type or the antisymmetrical coefficient type processes a pair of digital data having the mutually different times (including a delay time of zero) with the center of symmetry corresponding to a delay time equal to M/2 times as large as the sampling period. In addition, multiplication coefficients for the pair of the digital input data have at least the same absolute values.

The present invention has been made from the above-mentioned viewpoints. Conventionally, a series of digital data is multiplied by multiplication coefficients, and the other series of digital data is multiplied by multiplication coefficients. Then, multiplied results are added. On the other hand, the paired digital data trains are added together beforehand, and are then multiplied by multiplication coefficients. Thus, multiplication is effected only once. When M is an even number, there is no digital data which is to be paired with digital data given a delay time equal to M/2 as large as the sampling period. In this case, such digital data is multiplied by predetermined coefficients without addition.

According to the present invention, the digital input data is transferred in the forward direction from the digital signal processor in the forefront stage to the digital signal processor in the final stage, and is then transferred in the reverse direction from the digital signal processor in the final stage to the digital signal processor in the forefront stage. Thus it is possible to reduce the number of digital signal processors to half of that for the conventional device.

BRIEF DESCRIPTION OF THE DRAWINGS

FIG. 6 is a flowchart of an operation of the present invention; and

BEST MODE OF EMBODYING THE INVENTION

Figure 1:
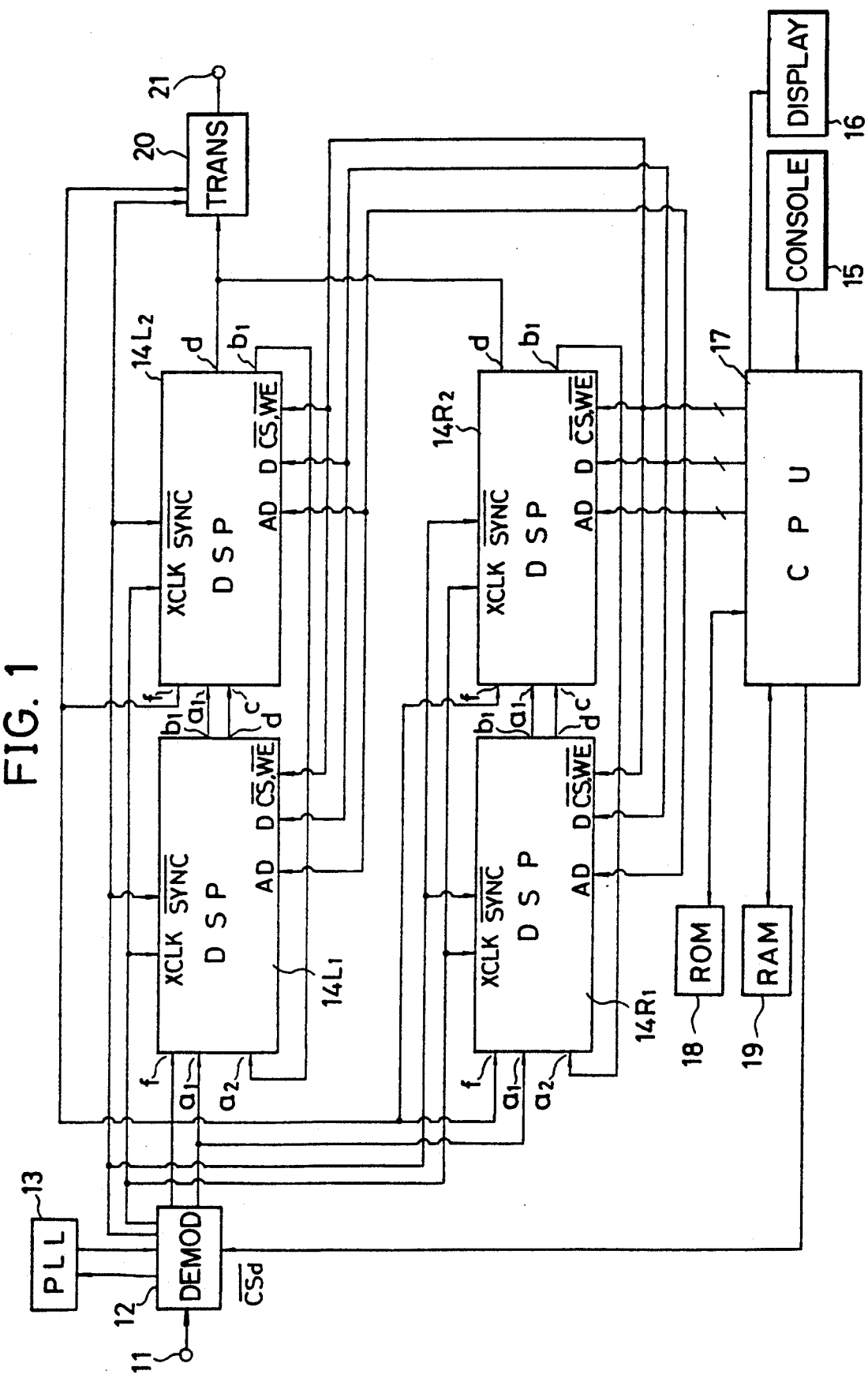
FIG. 1 is a block diagram of an FIR digital filter device according to an embodiment of the present invention.

Referring to FIG. 1, an input terminal 11 is supplied with a digital audio signal having a predetermined format, which is to be given a desired frequency-amplitude characteristic. The digital audio signal, or digital data is input to a reception part 12, which demodulates the received digital data. The reception part 12 can be formed by a known integrated circuit (IC), for example a digital audio data reception/demodulation IC manufactured by Sony Corporation (type number CX 23053).

A phase-locked loop (PLL) 13 is used for synchronizing the phase of a clock contained in demodulated digital data from the reception part 12 and the phase of a clock generated in the reception part 12. The input signal may be a serial signal or a parallel signal and depends on the structure of the device.

The demodulated digital data from the reception part 12 (an NRZ signal, for example) is supplied to digital signal processors (DSPs) 14L1 and 14R1. The DSPs 14L1 and 14R1 as well as DSPs 14L2 and 14R2 which will be described later can be formed as shown in FIG. 2.

Figure 2:
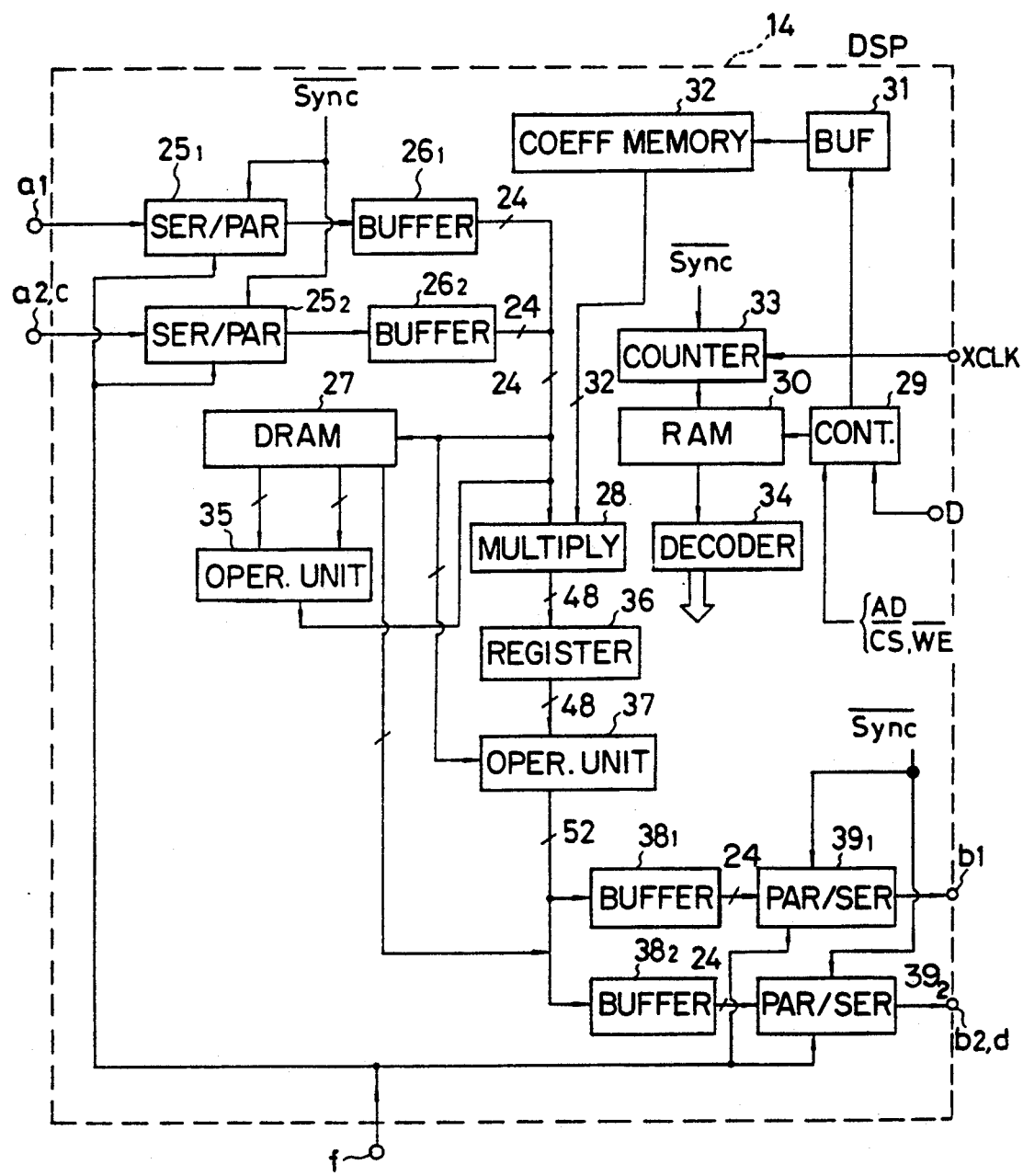
FIG. 2 is a block diagram of a digital signal processor.

The same reference numbers or the same signal names are given to the corresponding input and output terminals and signals in the digital signal processors (DSPs) 14L1, 14R1, 14L2 and 14R2 shown in FIG. 1, and the DSP in FIG. 2 in order to clearly show the correspondence between each DSP in FIG. 1 and the DSP in FIG. 2.

The DSPs 14L1 and 14L2 which are cascaded function as an FIR digital filter which performs an FIR digital filter operation which provides a predetermined characteristic (frequency-amplitude characteristic, for example) which is set through a console part 15 and is given to a left-channel signal out of a stereo signal, for example.

The cascaded DSPs 14R1 and 14R2 function as an FIR digital filter which performs an FIR digital filter operation which provides a predetermined characteristic (frequency-amplitude characteristic, for example) which is set through the console part 15 and is given to a right-channal signal of the stereo signal, for example.

The DSPs 14L1, 14L2, 14R1 and 14R2 are of the same structure and function in the same manner. Therefore, references not having suffixes such as L1, L2, R1 and R2, such as DSP 14, are used, when a description which holds true for each of the DSPs 14L1, 14L2, 14R1 and 14R2 is given in the following explanation.

The console part 15 for inputting a desired frequency-amplitude characteristic, is provided with a plurality of not-shown push button switches Sij (i=1, 2, ..., j), which serve as input parts individually inputting predetermined frequency-amplitude characteristics.

A display part 16 has a plurality of display elements (light-emitting diodes, for example), which indicate amplitudes of the respective frequency ranges related to the push button switches for individually inputting the predetermined frequency-amplitude characteristics. The desired frequency-amplitude characteristic which is input through the push button switches through the console part 15 is visually confirmed through the display elements.

A central processing unit (hereinafter simply referred to as CPU) 17 is connected to a read only memory (hereinafter simply referred to as ROM) 18 and a random access memory (hereinafter simply referred to as RAM) 19. The CPU 17 reads a program which is stored in the ROM 18 beforehand, and controls the DSPs 14 by the read program so as to perform a desired FIR digital filter operation which changes the amplitude of the digital input data in accordance with the frequency-amplitude characteristic set through the console part 15. Further, the CPU 17 writes necessary data into the RAM 19. Moreover, CPU 17 controls the display part 16 so as to display predetermined information, and controls the structural elements of the digital filter device.

Digital data which have been subjected to the FIR digital filter operation through the DSPs, are drawn from output terminals of the DSPs 14L2 and 14R2, and are supplied to a transmission part 20. The transmission part 20 modulates the supplied digital data in a modulation method suitable for digital transmission (a biphase modulation, for example), and outputs modulated digital data in serial form to a digital amplifier (not shown) through an output terminal 21.

The transmission part 20 can be formed by a conventional IC, for example, a digital audio modulation/transmission IC manufactured by Sony Corporation (type number CX 23033), for example.

A description is given of the embodied structure of each DSP 14. The digital input data through input terminals a1 and a2 are subjected to a serial/parallel conversion process through serial/parallel converters $25_1$ and $25_2$, respectively, each of which outputs 24-bit parallel data, for example. Each of the serial/parallel converters $25_1$ and $25_2$ inputs serial data and outputs data in parallel form in synchronism with an edge (rise edge, for example) of a synchronizing signal Sync supplied from the reception part 12. The synchronizing signal Sync has a period equal to the sampling period for the digital input data.

The parallel output data in digital form from the serial/parallel converters $25_1$ and $25_2$ pass through input buffers $26_1$ and $26_2$, respectively, and are supplied to a RAM 27 and a multiplier 28. The RAM 27 is a dynamic random access memory (DRAM) suitable for storing data.

A parameter control part 29 is supplied with a switching signal AD, a chip select signal CS, a write enable signal WE and data D, all of which are supplied from the CPU 17. The switching signal AD instructs the parameter control part 29 to output the data D to any one of a RAM 30, a transfer buffer 31 and a coefficient memory 32. The transfer buffer 31 outputs a control signal which specifies a transfer timing and a number of transfers.

The RAM 30 is a static RAM suitable for storing a program, and stores program data which is supplied from the CPU 17 after initialization. The coefficient memory 32 is a static RAM, which stores coefficients $a_1$-$a_n$ to be multiplied by the digital input data through the multiplier 28. The switching signal AD enables the coefficients to be transferred from the transfer buffer 31 to the coefficient memory 32. When the switch signal AD indicating transfer of the coefficients is input, coefficient transfer and access is carried out during the sampling period from the next synchronizing signal Sync.

A program counter 33 counts a system clock XCL supplied from the reception part 12, and is reset by the synchronizing signal Sync. The counter output of the program counter 33 is supplied, as an address signal, to the RAM 30. Program data (instruction) related to the counter output is read out of the RAM 30 and supplied to a decoder 34, which decodes the read-out program data. Then, the decoded program data is output, as a control signal, to various circuit parts of the DSP 14.

The above-mentioned system clock CLK defines a cycle time of instructions which form the program. When instructions are executed for K times (K is 64 or 128 for example) during one sampling period, the frequency of the system clock CLK is set to a frequency K times the sampling frequency fs.

The RAM 27 delays the digital input data by a time equal to natural number times the sampling period. The delayed data from the RAM 27 is a pair of digital data having mutually symmetrical delay times with the center of symmetry corresponding to a predetermined delay time. The pair of digital data are supplied to an operation unit 35.

The operation unit 35 performs a pre-addition of the delayed digital data when the present FIR digital filter device is of the symmetrical type, and on the other hand, performs a pre-subtraction thereof when it is of the antisymmetrical type. The operation results are supplied to the multiplier 28, which multiplies the operation results and the predetermined coefficients which are 32-bit parallel data supplied from the coefficient memory 32.

The multiplied results derived from the operation unit 28 are 48-bit parallel data, and are supplied to an operation unit 37 through a register 36 with a shifter. The operation unit 37 adds up the received multiplied results. Digital data derived from the operation unit 37 are supplied to output buffers $38_1$ and $38_2$, which are also supplied with the delayed digital data from the RAM 27.

Digital data supplied from each of the output buffers $38_1$ and $38_2$ is 24-bit parallel data. The digital data from the output buffers $38_1$ and $38_2$ are supplied to parallel/serial converters $39_1$ and $39_2$, respectively, each of which converts the supplied digital data into serial data. The converted serial data from the parallel/serial converters $39_1$ and $39_2$ are output through output terminals b1 and b2 (or d).

The input terminals a2 and c, and the output terminals b2 and d are time-shared. Input carry-over data (described later) applied to the input terminal c passes through the serial/parallel converter $25_2$, the input buffer $26_2$ and a bus wire, and is supplied to the operation unit 37. The carry-over data is added up through the operation unit 37, the output signal of which passes through the bus wire, the output buffer $38_2$ and the parallel/serial converter $39_2$, and is then output through the output terminal d.

A reference f indicates an input terminal which receives a data clock signal BCLK and a channel discrimination signal LRCK which are to be supplied to the serial/parallel converters $25_1$ and $25_2$ and the parallel/serial converters $39_1$ and $39_2$. These signals define a serial data inputting timing and a parallel data outputting timing.

Figure 3:
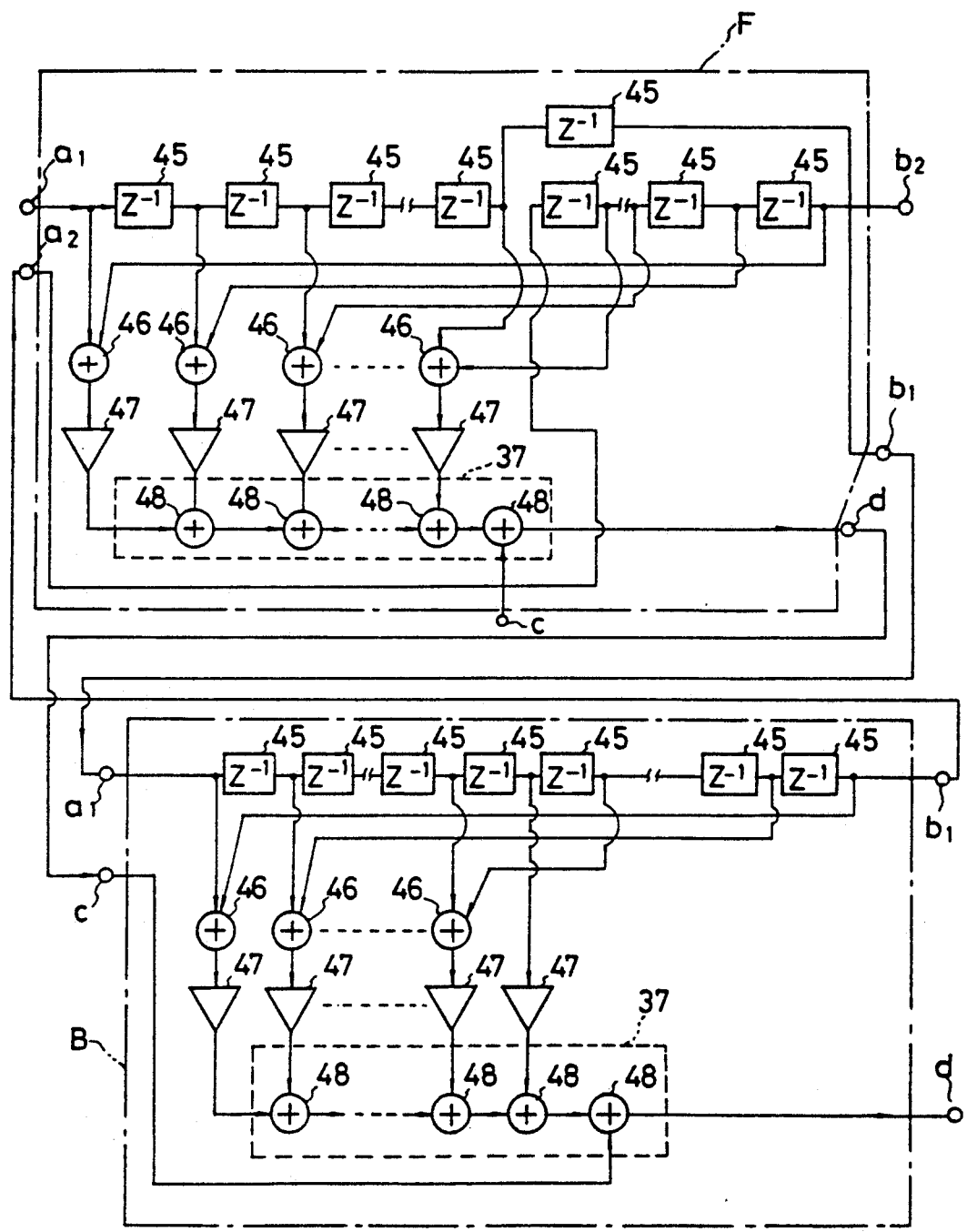
FIGS. 3, 4 and 5 are diagrams of equivalent hardware circuits showing first, second and third embodiments of the digital filter operation according to the present invention, respectively.
Figure 4:
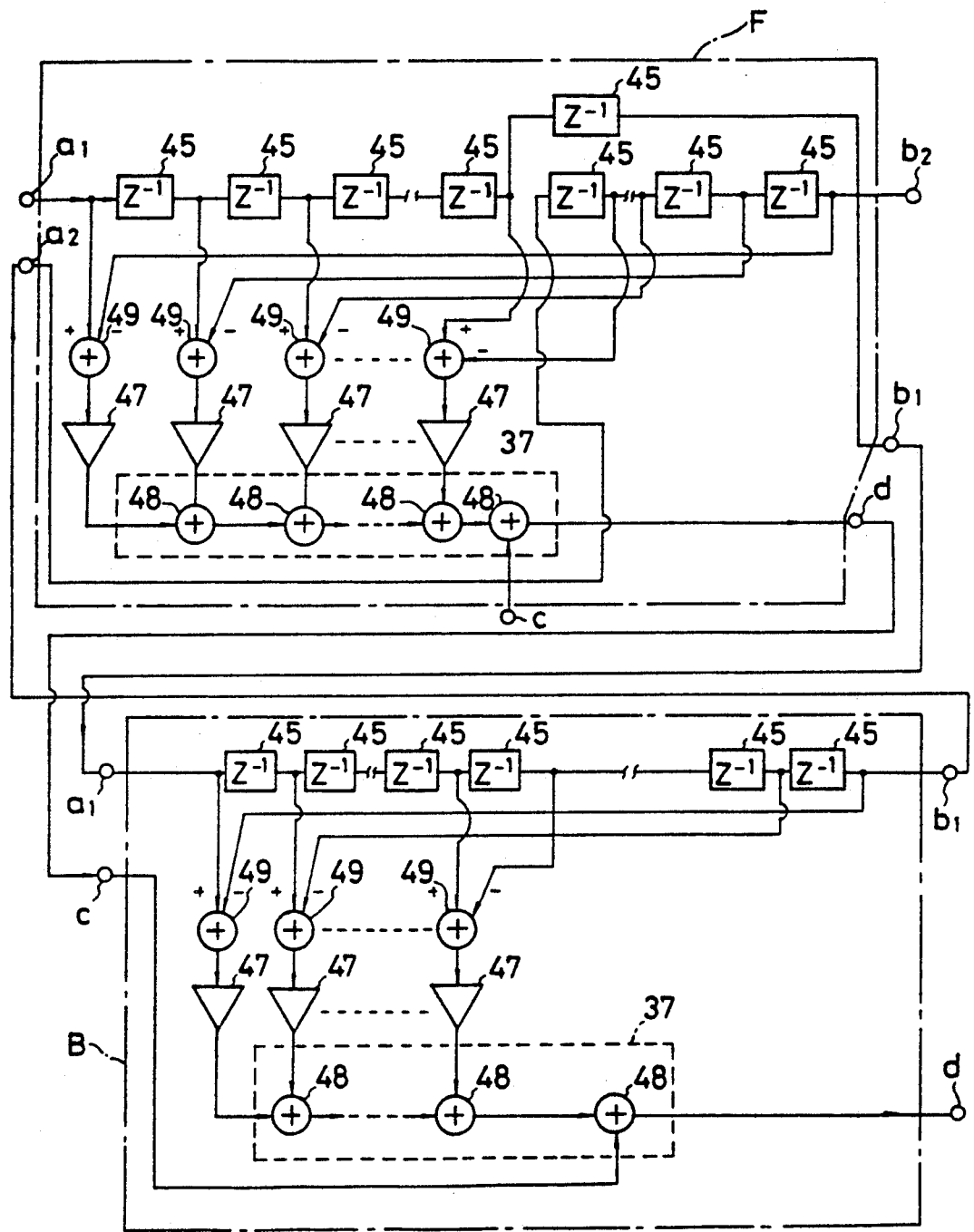
Figure 5:
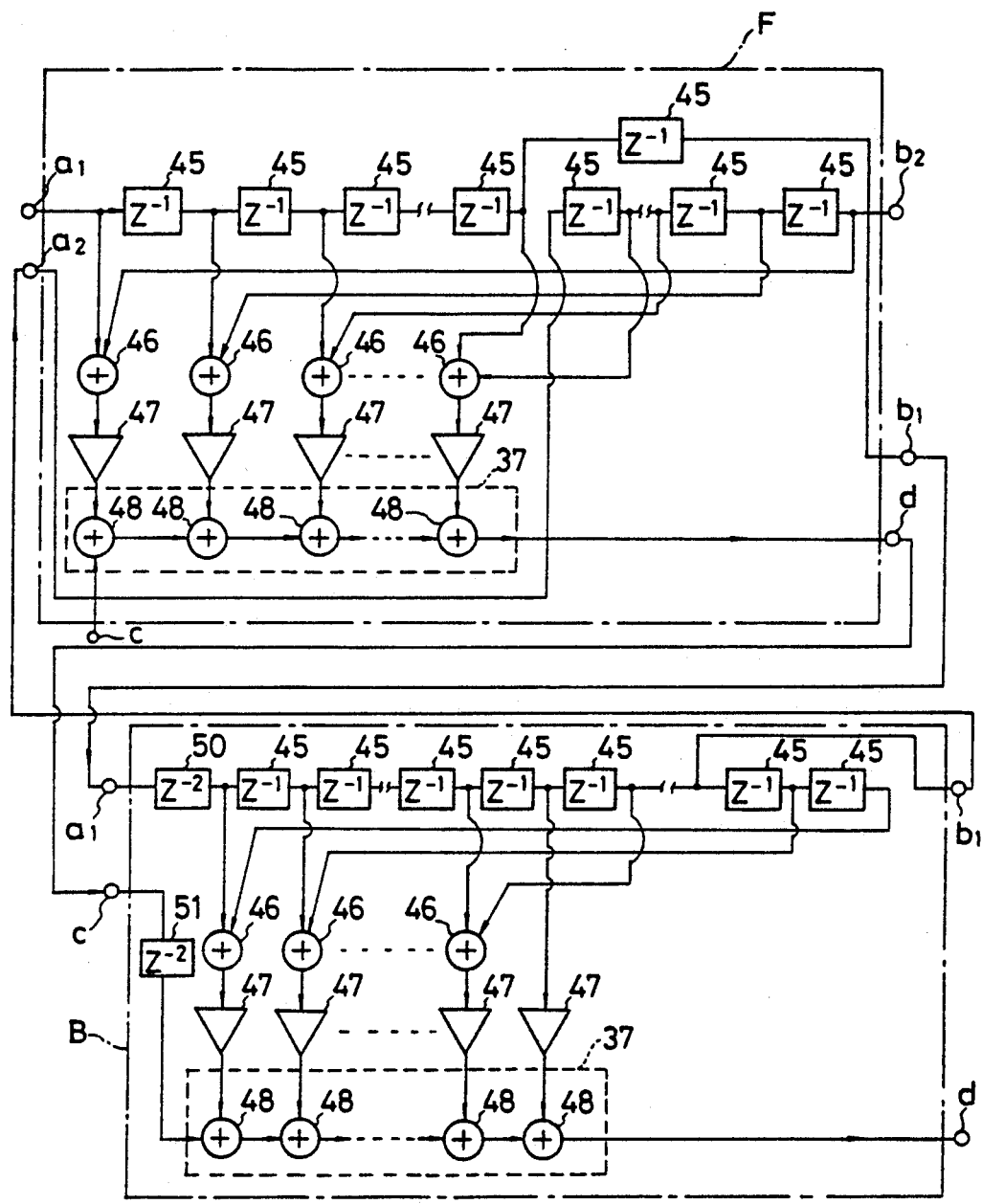

A description is given of embodiments of the digital filter operation provided by a circuit portion which is made up of the RAM 27, the operation unit 35, the multiplier 28 and the operation unit 37, by referring to FIGS. 3 through 5. In FIGS. 3 through 5, those parts which are the same as those in FIGS. 1 and 2 are given the same reference numerals, and a description thereof is omitted. In FIGS. 3 through 5, a one-dot chain line frame F is a functional block related to the DSP of the front stage out of the two cascaded DSPs 14, and a one-dot chain line block B is a functional block related to the DSP of the rear stage. That is, the DSP block F corresponds to the DSP14L1 or 14R1, and the DSP block B corresponds to the DSP 14L2 or 14R2.

FIG. 3 is a block diagram of a hardware configuration which executes a digital filter operation of the symmetrical coefficient type FIR digital filter device according to the first embodiment of the invention. Delay elements 45 delay digital data applied thereto by one sampling period. The block F has n cascaded delay elements 45 between the input terminal a1 and the output terminal b1, and n cascaded delay elements 45 between the input terminal a2 and the output terminal b2. Therefore, delay elements 45 in the block F amount to 2n. That is, the DSP in the front stage has an even number of delay elements 45. The delay by the delay elements 45 is achieved by the RAM 27. The second DSP corresponding to the block B has 2m cascaded delay elements 45 between the input terminal a1 and the output terminal b1.

Therefore, the present digital filter device has M $(=2n+2m)$ delay elements 45 in total. As a result, digital data having M different delay times between one sampling period and M sampling periods are generated from the digital input data applied to the input terminal a1 of the first block F.

Every adder 46 adds a pair of pieces of related digital data having the mutually symmetrical delay times with the center of symmetry corresponding to a delay time equal to M/2 times as large as the sampling period. The addition by the adders 46 is achieved by the aforementioned operation unit 35.

The digital filter device according to the present embodiment is of the symmetrical type. A pair of digital data is to be multiplied by coefficients of the same sign and the same value. In the present embodiment, a pair of pieces of digital data is added together through the adder 46, and then the added result is supplied to the multiplier 47. In the actual hardware structure, the multiplier 47 can be formed by a single multiplier 28 as shown in FIG. 2.

Adders 48 add up the multiplied results from the multipliers 47, and output the accumulated result to the output terminal d. The accumulative addition can be achieved by the aforementioned operation unit 37. The accumulative addition result drawn through the output terminal of the DSP block F in the front stage is supplied, as carry-over data, to the input terminal c of the DSP block B in the rear stage, and is then added to the accumulative addition result provided by the DSP block B in the rear stage.

The digital input data supplied to the input terminal a1 of the DSP block F in the front stage is delayed by n sampling periods through n delay elements 45, and is applied to the output terminal b1. Then, the delayed digital data through the output terminal b1 is transferred in the forward direction to the input terminal a1 of the DSP block B in the rear stage and is further delayed by 2m sampling periods through 2m delay elements 45 in the block B. Thereafter, the delayed digital data passes through the output terminal b1 of the block B and is then transferred in the reverse direction to the input terminal a2 of the DSP block F in the front stage. Then the transferred digital data is further delayed by n sampling periods through n delay elements 45 in the block F, and is then added to the adders 46.

As a result, the delay time which is given to the digital data passing in the forward direction through the DSP block F in the front stage except the DSP block B in the rear stage which is the final stage, is identical to that for the reverse direction.

The carry-over data drawn through the output terminal d of the DSP block B in the rear stage is output, as the output of the FIR digital filter, to the transmission part 20 shown in FIG. 1.

It is noted that the output terminal b2 and the input terminal c of the DSP block F in the front stage are not used. However, as will be described later, the output terminal b2 and the input terminal c are used when the DSP block F is used as an intermediate stage of an FIR digital filter having a DSP including three DSP blocks F or more.

FIG. 4 is a block diagram of a hardware configuration which executes a digital filter operation of the antisymmetrical coefficient type FIR digital filter device according to the second embodiment of the present invention. In FIG. 4, those parts which are the same as those shown in FIG. 3 are given the same reference numerals, and a description thereof is omitted.

The embodiment shown in FIG. 4 is distinguishable from the embodiment shown in FIG. 3 in the following. First, the DSP block B in the rear stage has an odd number of delay elements 45 (2m−1 for example). Second, the adders 46 used in the embodiment shown in FIG. 3 are replaced with subtracters 49. The embodiment shown in FIG. 4 has M delay lines 45 in which M is an odd number (2n+2m−1 for example).

That is, in the antisymmetrical coefficient type FIR digital filter device, the multiplication coefficients for a pair of digital data having the mutually symmetrical delay times with a delay time equal to M/2 times as large as the sampling period have the same absolute values, but have the different signs. Therefore, in the second embodiment, the arithmetical subtraction (substantial algebraic addition) is carried out by the subtracters 49.

FIG. 5 is a block diagram of a hardware configuration which executes a digital filter operation of the symmetrical coefficient type FIR digital filter device according to the third embodiment of the present invention. In FIG. 5, those parts which are the same as those shown in FIG. 3 are given the same reference numerals, and a description thereof is omitted.

The embodiment shown in FIG. 5 is formed by modifying the embodiment shown in FIG. 3 so that many operations and data transfer between the DSP blocks F and B are not made completed within one sampling period. Referring to FIG. 5, delay elements 50 and 51 each presenting a delay time twice the sampling period are connected to the input terminals a1 and c of the DSP block B in the rear stage, respectively. Thereby, the operations of the adders 46, the multipliers 47 and the adders 42 of the DSP block F in the front stage can precede by a time equal to twice the sampling period as compared with the corresponding operations in the DSP block B.

Therefore, data transfer between the DSP blocks F and B is being carried out while the operations are being in the DSP blocks F and B.

In actuality, the delay element 50 is formed by the output buffer $38_1$ and the input buffer $26_1$, and the delay element 51 is formed by the output buffer $38_2$ and the input buffer $26_2$.

When l digital filter coefficients are originally necessary to perform a digital filter operation, the same digital filter operation can be achieved by about 1/2 coefficients according to the FIR digital filter device of the present invention. As a result, it becomes possible to reduce the time it takes to set the coefficients in the digital filter device according to the present invention.

In the FIR digital filter device according to the present invention, the operation on data to be executed for every sampling period can be done by distributed processing.

A description is given of an operation of adjustment of the frequency-amplitude characteristic of the digital input data by the FIR digital filter which is substantially formed by the DSPs 14 performing the aforementioned digital filter operation. The adjustment operation is controlled so that the CPU 17 changes a program to be stored in the FIR digital filter device or changes multiplication coefficients.

The adjustment operation by the CPU 17 is described below by referring to FIG. 6.

Figures 6A, 6B, 7:
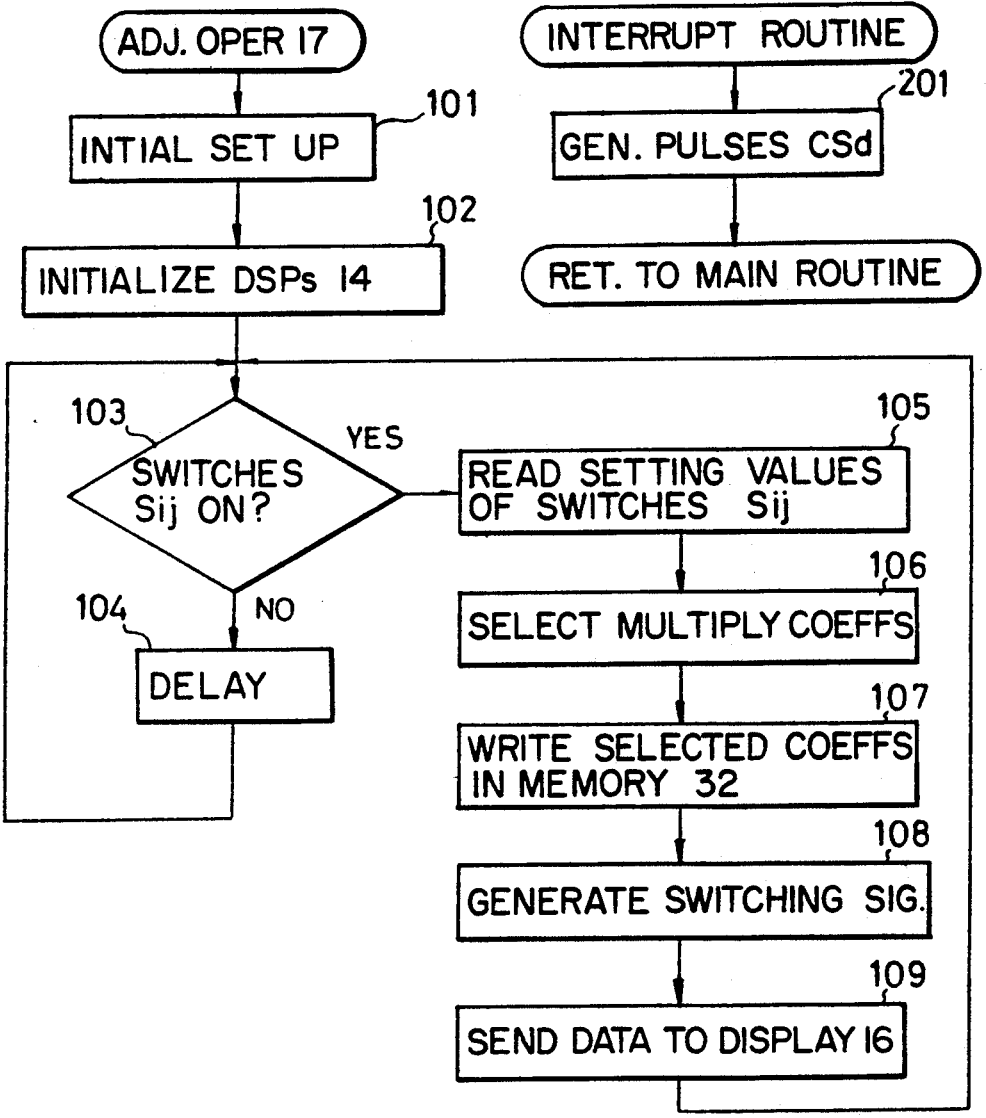
FIG. 7 is a diagram showing the relation in connection of a plurality of digital signal processors according to the present invention.

Referring to FIG. 6(A), after the procedure starts, an initial set up for the CPU 17 is carried out in step 101. Next, the DSPs 14 are initialized in step 102. Next, in step 103, it is determined whether the push button switches Sij of the console part 15 are ON or OFF. When the push button switches Sij are OFF, the procedure waits for a predetermined time, and then returns to step 103. On the other hand, when the push button switches are ON, the procedure proceeds to step 105.

In step 105, the setting values of the push buttom switches Sij are read. Subsequently, in step 106, the CPU 17 selects one of sets of multiplication coefficients (sets of multiplication coefficients based on sets of Sij are stored in the ROM 18 beforehand). Then, in step 107, the CPU 17 writes the selected set of multiplication coefficients in the coefficient memory 32 provided in the DSPs 14. Then the CPU 17 generates the switching signal in step 108, and sends the display part 16 data to be displayed in step 109. Then the procedure returns to step 103.

The flowchart of FIG. 6(B) shows an interrupt routine for generating pulses CSd which are sent to the reception part 12 from the CPU 17 at predetermined intervals. When an interrupt occurs, the CPU 17 generates the pulses CSd in step 201. Then, the procedure returns to the main routine.

The FIR digital filter device according to the present invention may be configured by using an arbitrary number of DSPs as necessary. FIG. 7 shows the relation in connection between DSPs $14_1$-$14_N$ (N is a natural number equal to or more than 3) which form an FIR digital filter device of the symmetrical or antisymmetrical coefficient type.

Input terminals a1, a2 and c, and output terminals $b_1$, $b_2$ and d of the DSPs $14_1$-$14_N$ shown in FIG. 7 correspond to those having the same references shown in FIGS. 1 through 5. Each of the DSPs $14_1$-$14_N$ shown in FIG. 7 is of the same structure as the DSP block F shown in FIGS. 1 through 5. The DSP $14_N$ shown in FIG. 7 is the same as the aforementioned DSP block B.

The terminals $b_2$ and c of the DSP $14_1$ in the first stage shown in FIG. 7 are not used.

The embodiment shown in FIG. 5 is the FIR digital filter device of the symmetrical coefficient type. Each of the adders 46 provided in the DSP blocks F and B can be replaced with a subtracter so that an FIR digital filter device of the antisymmetrical coefficient type can be formed. It is also possible to design the the DSP block B to have an odd number of delay elements 45.

Industrial Applicability

As described above, according to the present invention, the FIR digital filter device is designed to add a pair of digital data, multiply the addition results by multiplication coefficients having at least the same absolute values, and add up the multiplied results. Thus, the number of operations that operations are repetitively carried out can be reduced to about half of that for a conventional digital filter device. Further, the present invention is designed to transfer digital data from DSPs in the front stage to DSPs in the rear stage and then transfer the digital data from the DSPs in the rear stage to the DSPs in the front stage. Thus, the present invention can be configured by a reduced number of DSPs and is thus economical.

Further, according to the present invention, the digital filter operation can be performed by three DSPs or more connected in cascade. In this configuration, it is possible to further reduce the operation time and thus process digital audio signals in real time without decreasing economical efficiency. Moreover, since the RAM for storing digital data is accessed for every sampling, the RAM can be formed by a dynamic RAM in which a refresh circuit is omitted. From this and aforementioned viewpoints, a chip of reduced size can be used. Consequently, the FIR digital filter devices according to the present invention are extremely economical.

I claim:

1. An FIR digital filter device which generates M pieces of delayed digital data having mutually different delay times equal to a natural number times a sampling period for digital input data, multiplies said M pieces of delayed digital data and said digital input data by multiplication coefficients, and adds the multiplied results to form output data, said FIR digital filter device comprising a plurality of cascaded digital signal processors each including a delay unit, a multiplier, and a first operation unit for performing algebraic addition, and a second operation unit for performing accumulative addition, wherein said digital input data is transferred in the forward direction through said delay units of said digital signal processors between the forefront stage and the final stage, and is then transferred in the reverse direction through said delay units of the digital signal processors between the final stage and the forefront stage, each of said digital signal processors except for said digital signal processor in the final stage provides said digital input data with the same delay time for the forward and reverse directions, so that said M pieces of delayed digital data are generated, each of said digital signal processors multiplies the operation results obtained by performing the algebraic addition of said delayed digital data and said digital input data having mutually symmetrical delay times with the center of symmetry corresponding to a delay time equal to M/2 times as large as the sampling period, and multiplies the algebraic addition results by said multiplication coefficients through the related multipliers, said digital processor in the final stage multiplies said delayed digital data having the delayed time equal to M/2 times as large as the sampling period when M is an even number, the digital signal processor in the forefront stage adds the multiplied results through the second operation units and outputs the accumulative addition results as carry-over data to the next stage, the digital signal processors in the second and subsequent stages add the results supplied from said second operation units and said carry-over data supplied from the digital signal processor in the previous stage, and output the addition results as carry-over data to the next stage, the digital signal processor in the final stage outputs, as said output data of the FIR digital signal processor, the carry-over data derived from the digital signal processors in the final stage, the digital processor in the final stage delaying the carry-over data by a predetermined sampling period and subjecting said delayed carry-over data to the digital filter operation by said delay unit, said first and second operation units and said multiplier provided therein.

2. An FIR digital filter device as claimed in claim 1, wherein said delay unit is a dynamic random access memory which shifts an address for each sampling period.

3. An FIR digital filter device as claimed in claim 1 wherein said device is of the symmetrical coefficient type.

4. An FIR digital filter device as claimed in claim 1 wherein said device is of the antisymmetrical coefficient type.

* * * * *